United States Patent
Pisasale et al.

(10) Patent No.: US 7,414,459 B2
(45) Date of Patent: Aug. 19, 2008

(54) ARCHITECTURE FOR IMPLEMENTING AN INTEGRATED CAPACITANCE

(75) Inventors: Michelangelo Pisasale, Catania (IT); Vincenzo Sambataro, S. M. Di Licodia (IT); Maurizio Gaibotti, Cesano Maderno (IT); Michele La Placa, Cefalù (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 59 days.

(21) Appl. No.: 11/444,287

(22) Filed: May 31, 2006

(65) Prior Publication Data

US 2007/0024123 A1    Feb. 1, 2007

(30) Foreign Application Priority Data

Jun. 1, 2005    (IT)    ............... MI2005A1027

(51) Int. Cl.
*H02M 3/06*    (2006.01)
(52) U.S. Cl. ....................... 327/543; 307/109
(58) Field of Classification Search ............ None
See application file for complete search history.

(56) References Cited

U.S. PATENT DOCUMENTS

| 4,295,089 A | * | 10/1981 | Cooperman | ................ 323/351 |
| 5,254,883 A | * | 10/1993 | Horowitz et al. | ............. 326/30 |
| 6,882,015 B2 | * | 4/2005 | Bernstein et al. | ............ 257/379 |
| 6,949,967 B2 | * | 9/2005 | Wang et al. | ................ 327/337 |

* cited by examiner

*Primary Examiner*—N. Drew Richards
*Assistant Examiner*—Terry L Englund
(74) *Attorney, Agent, or Firm*—Gardere Wynne Sewell LLP

(57) ABSTRACT

An architecture for implementing an integrated capacity includes a capacitive block inserted between first and second voltage reference. The block is formed The block is formed from elementary capacitive modules. An enable block is inserted between the first voltage reference and the capacitive block and includes switches connected to the elementary capacitive modules and driven on their control terminals by control signals. Each switch of the enable block is inserted between the first voltage reference and a first end of a corresponding elementary capacitive module. A verify and enable circuit is connected to the first voltage reference, as well as at the input of the first end of the elementary capacitive modules and at the output of the control terminals of the switches of the enable block. The verify and enable circuit detects the presence of a current value in each of the elementary capacitive modules and, if said current is detected, disables that elementary capacitive module of the capacitive block using the corresponding switch of the enable block.

27 Claims, 4 Drawing Sheets

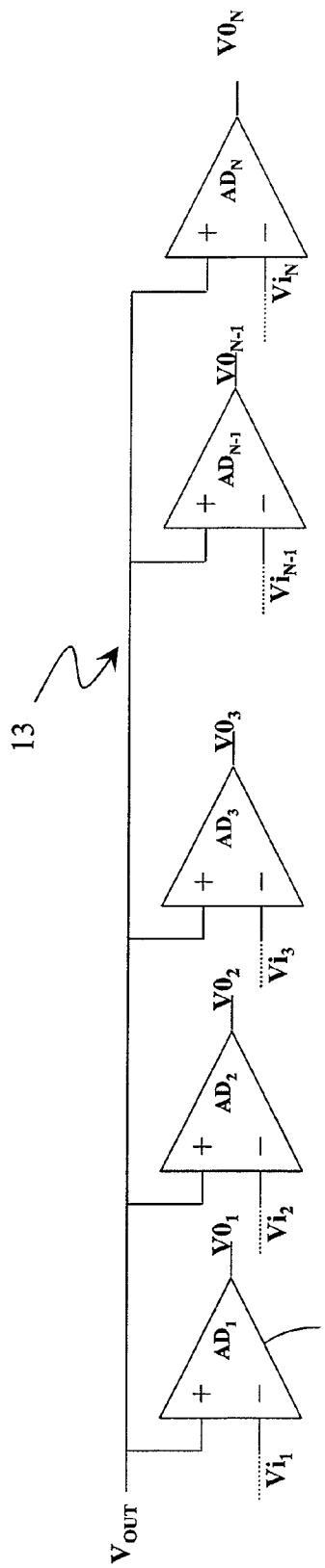
FIG. 4A
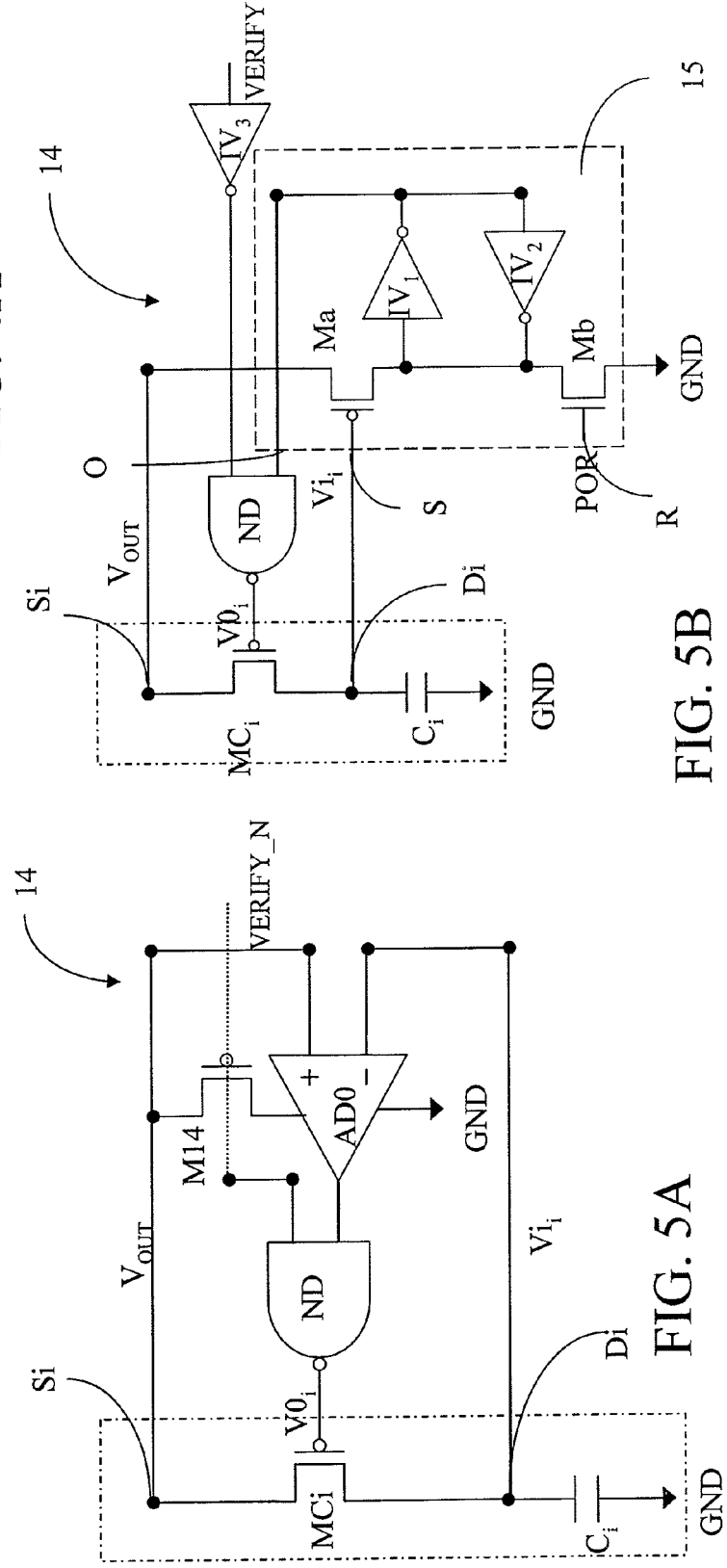
FIG. 5B
FIG. 5A

ARCHITECTURE FOR IMPLEMENTING AN INTEGRATED CAPACITANCE

PRIORITY CLAIM

The present application claims priority from Italian Patent Application No. MI2005A 001027 filed Jun. 1, 2005, the disclosure of which is hereby incorporated by reference.

BACKGROUND OF THE INVENTION

1. Technical Field of the Invention

The present invention relates to an architecture for implementing an integrated capacitance.

The invention particularly, but not exclusively, relates to an architecture for implementing an integrated capacity to be used as tank capacitor in a converter of the Voltage Down type and the following description is made with reference to this field of application by way of illustration only.

2. Description of Related Art

Different architectures for converters of the voltage down type are known in the literature and are widely used.

In particular, in the field of Flash memories, it is known to use converters of the voltage down type or VDC converters (acronym for "Voltage Down Converter") to allow the use of transistors with gate oxides having thickness lower than 40 Å (Angstrom) in applications requiring conventional supply voltage values, in particular equal to 3V.

In this case, a VDC converter of the known type allows one to obtain a regulated voltage with values equal or lower than 1.8V starting from an external supply voltage in the range 2.4-4.0V. It is also possible, by using a booster circuit inserted in the VDC converter, to obtain a correct regulation also with an external supply voltage with values up to 2V.

In particular, known VDC converters essentially comprise an open or closed loop regulation circuit connected to an output driver, realized for example by means of a MOS transistor with N channel or P channel.

In the case of application to a Flash memory of the NOR type, characterized by extremely quick impulsive consumption (from 0 to tens of mA in less than 10 ns) due to the reading architecture of the asynchronous type with response times in the order of 50 ns, it is also known to use a channel width modulation VDC converter, schematically shown in FIG. 1 and globally indicated with reference 1.

The channel modulation VDC converter 1 essentially comprises a regulator 2 of the closed loop series type connected to an output driver 3, in particular realized by means of a Mout transistor of the NMOS type.

The regulator 2 has the task of generating a reference voltage signal $V_{REF}$ having a value equal to a voltage value which is to be present at the output.

In particular, the regulator 2 comprises an operational amplifier A supplied by a first voltage reference, in particular a supply voltage reference Vdd and having a first input terminal connected to an input terminal IN of the channel modulation VDC converter 1, a second input terminal connected, by means of a first impedance element Z1, to a second voltage reference, in particular a ground reference GND, as well as an output terminal connected to a control terminal of the transistor Mout of the output driver 3.

The input terminal IN of the channel modulation converter VDC 1 supplies to the first input terminal of the operational amplifier A of the regulator 2 a stable voltage signal $V_{BGAP}$.

It is also possible to use, as supply voltage reference of the operational amplifier A, a boosted voltage reference Surv.

The regulator 2 also comprises a second impedance element Z2 connected between the second input terminal of the operational amplifier A and a first conduction terminal of the transistor Mout of the output driver 3, having in turn a second conduction terminal connected to the supply voltage reference Vdd and the control terminal connected to a terminal O3 of the output driver 3.

The channel modulation converter VDC 1 also comprises a stand by driver 4, in particular realized by means of a transistor Msb of the NMOS type inserted between a first voltage reference, in particular a supply voltage reference Vdd and an output terminal OUT of the channel modulation VDC converter 1 and having a control terminal connected to the output terminal O3 of the output driver 3.

Moreover, the channel modulation converter VDC 1 comprises a power block 5, inserted between the supply voltage reference Vdd and the output terminal OUT of the channel modulation converter VDC 1 and realized by means of a plurality of transistors M1 ... MN, in particular transistors of the NMOS type, inserted, in parallel to each other, between the supply voltage reference Vdd and the output terminal OUT and having the control terminals connected to each other and to the control terminal of the transistor Msb of the stand by driver 4.

In particular, the transistors M1 ... MN of the power block 5 are connected to the supply voltage reference Vdd by means of a plurality of switches SW1 ... SWN subjected to a plurality of control signals S1 ... SN generated by a control block 6, in turn being input an output voltage signal VOUT on the output terminal OUT of the channel modulation converter VDC 1 and the voltage reference signal $V_{REF}$ generated by the regulator 2.

In this way, the power block 5 is able to supply a current value requested by a load connected to the channel modulation converter VDC 1 by means of turning on the transistors M1 ... MN. In particular, the control block 6 compares the value of the reference voltage signal VREF with the value of the output voltage signal VOUT and drives, by means of the control signals S1 ... SN the partial or total turn on and off of the transistors M1 ... MN, which can thus be considered output drivers.

In this way, the channel modulation converter VDC 1 allows to adapt, quickly enough, the transconductance value of the output driver 3 on the basis of the current requests of a load associated with the converter itself. In particular, the power block 5 allows to control this transconductance value through a dynamic modulation of the channel width W thanks to the activation/deactivation of the transistors M1 ... MN in parallel to each other, thus obtaining a regulated output voltage signal $V_{OUT}$.

Moreover, the stand by driver 4 realizes an open loop replication of the reference voltage signal $V_{REF}$, for supplying a weak current value requested in the stand-by mode, thus allowing the turn off of the power block 5 to limit the overall consumption of the channel modulation converter VDC 1 in this mode.

The channel modulation converter VDC 1 finally comprises a so called tank capacitor $C_{TANK}$ inserted between its output terminal OUT and the ground reference GND.

This tank capacitor $C_{TANK}$ allows to sustain the output voltage signal $V_{OUT}$ in the brief transient necessary for the channel modulation converter VDC 1 to reach an activation state of the regulation. In other words, the role of the tank capacitor $C_{TANK}$ is that of addressing currents of the impulse type dissipated by a load connected to the channel modulation converter VDC 1 and thus avoid a temporary "breakdown" of the regulated output voltage signal $V_{OUT}$.

To do this it is possible to use a capacitor having a value equal to only 2 nF, making the channel modulation converter VDC 1 compatible with an integrated solution.

In reality, in sub-micrometric technologies with oxide thickness in the order of 40 Angstrom, to avoid relatively low performances due to the faultiness of the oxide layers, this tank capacitor $C_{TANK}$ is to be realized through the series of two capacitors of double value, as shown in FIG. 2.

It is to be remembered in fact that, in general, using a series of capacitors is very expensive in terms of area occupation on the silicon and thus unadvised in integrated applications. In the case at issue, having to use capacitors with high value (in the order of nano-farads), and to avoid having to "eliminate" a device which, in the testing step, has a fault on these capacitors the series of two capacitors is used so that, if one of these capacitors has a "leakage" current the presence of the other capacitor allows to ensure the regular operation, the possibility that both the capacitors have leakage currents being very low.

This solution however implies a great waste of integration area on silicon and thus makes the channel modulation converter VDC 1 less attractive for integrated applications in these technologies.

There is accordingly a need for providing an integrated capacitor, in particular to be used as tank capacitor in a channel modulation converter VDC, having reduced integration area occupation on silicon so as to allow to overcome the limits and the drawbacks still affecting the solutions used by the prior art.

SUMMARY OF THE INVENTION

In accordance with the present invention an architecture is presented for splitting an integrated capacitor in a plurality of modular capacitors which can be activated in a selective way.

In an embodiment, an architecture for implementing an integrated capacitance, comprises a capacitive block inserted between a first and a second voltage reference comprising a plurality of elementary capacitive modules. An enable block is inserted between said first voltage reference and said capacitive block and comprises a plurality of switches connected to said elementary capacitive modules, the switches driven on control terminals by a plurality of control signals, each switch of said enable block being inserted between said first voltage reference and a first end of a corresponding elementary capacitive module, a second end of the elementary capacitive module connected to said second voltage reference. A verify and enable circuit is connected to said first voltage reference and to the input of said first end of said elementary capacitive modules and to the output of said control terminals of said switches of said enable block, said verify and enable circuit detecting the presence of a current value in each elementary capacitive module and, if said current is detected, disabling said elementary capacitive module of said capacitive block by means of said corresponding switch of said enable block.

In an embodiment, the foregoing architecture is utilized to form a tank capacitor for a channel modulation converter.

In another embodiment, an integrated circuit comprises a first capacitor and a second capacitor. A first transistor switch is coupled to a reference voltage and is coupled in series with the first capacitor at a first node, and a second transistor switch is coupled to the reference voltage and is coupled in series with the second capacitor at a second node. A first sensor circuit is coupled to the first node and operable to detect leakage current with respect to the first capacitor and in response thereto disable the first transistor switch, and a second sensor circuit is coupled to the second node and operable to detect leakage current with respect to the second capacitor and in response thereto disable the second transistor switch.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 4A schematically shows a detail of the architecture of FIG. 3;

FIGS. 5A and 5B schematically show a first and a second embodiment of the portion of FIG. 4B.

DETAILED DESCRIPTION OF THE DRAWINGS

Figure 3:
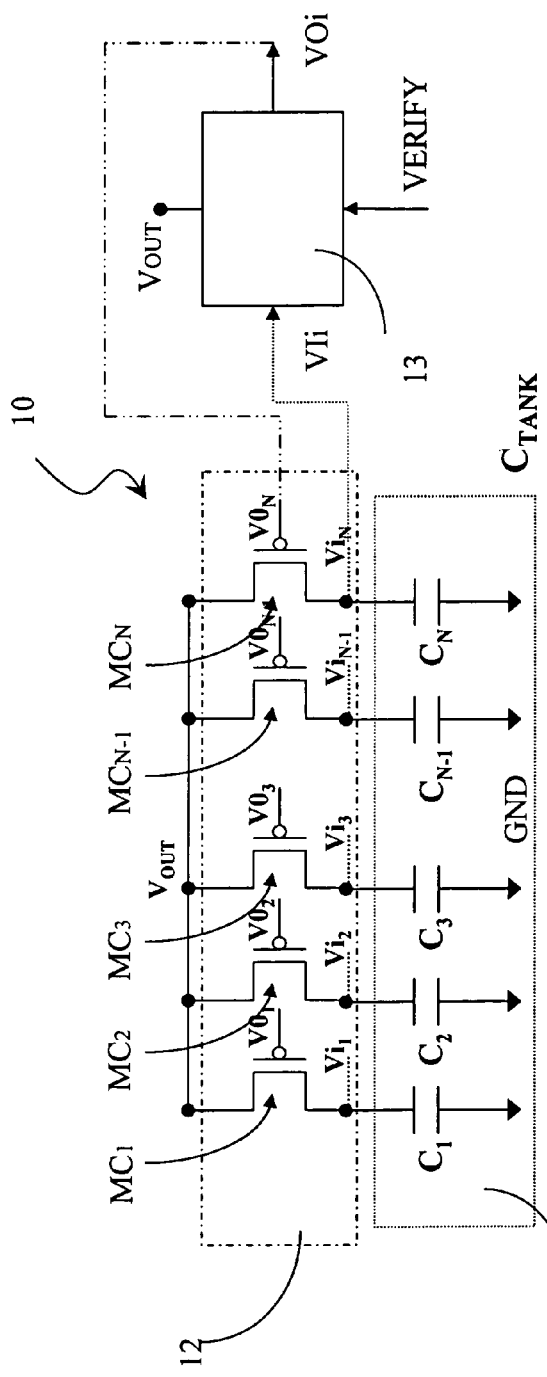
FIG. 3 schematically shows an architecture for implementing an integrated capacitor realized according to an embodiment of the invention.

With reference to these figures, and in particular to FIG. 3, the reference 10 globally and schematically indicates an architecture for implementing an integrated capacitor realized according to an embodiment of the invention.

The architecture 10 comprises, in particular, a capacitive block 11 inserted between a first voltage reference, in particular an inner supply voltage reference $V_{OUT}$, and a second voltage reference, in particular a ground reference GND.

The capacitive block 11 comprises in turn a plurality of elementary capacitive modules, indicated as single capacitors $C_1 \ldots C_N$, N being the number of elementary capacitive modules comprised in the capacitive block 11.

Advantageously according to the invention, the architecture 10 also comprises an enable block 12, inserted between the inner supply voltage reference $V_{OUT}$ and the capacitive block 11.

The enable block 12 comprises a plurality of switches, realized by means of PMOS transistors and indicated with $MC_1 \ldots MC_N$, driven by means of a plurality of control signals $VO_1 \ldots VO_N$ suitably applied to their control terminals.

In particular, each elementary capacitive module or capacity Ci of the capacitive block 11 corresponds to a switch or transistor MCi, the transistor MCi being inserted between the inner supply voltage reference $V_{OUT}$ and a first end of the capacitor Ci, having in turn a second end connected to the ground GND.

Advantageously according to the invention, the capacitive block 11 is thus made of N elementary capacitive modules, each of them being apt for being activated/deactivated by means of a corresponding switch comprised in the enable block 12.

These elementary capacitive modules are suitably sized so that the sum of all the respective capacitive values is equal to a capacitance maximum value which is to be obtained.

Moreover, the PMOS transistors which realize the switches of the enable block 12 are preferably of the low voltage type with low turn on resistance value, RON.

When the architecture 10 is integrated on silicon, these transistors MCi allow to easily deactivate the corresponding elementary capacitive modules Ci in case of faultiness of the oxide which realizes these elementary capacitive modules Ci.

Moreover, the transistors MCi are sized, in a way subordinate to the turn on resistance value RON, to minimize a value of total resistance seen in series to the capacitive block 11 not to degrade the response of the capacitor implemented by the architecture 10 and thus the performance of a system such as a channel modulation converter VDC this architecture would be associated with.

In a simulation, it has been verified that a turn on resistance value RON equal to about 5 Ohms per elementary capacitive module of value equal to 20 Pico-farad does not affect the performance of a channel modulation converter VDC using the architecture 10 for implementing a tank capacitor $C_{TANK}$, as seen in relation to the prior art.

Advantageously according to embodiments of the invention, the architecture 10 also comprises a verify and enable circuit 13 able to control, at each turn on of the capacity implemented by the architecture 10, the integrity of the elementary capacitive modules, due to the verification of the presence or not of a current value in these modules and of disabling the modules for which this integrity verification gives a negative result. The verify and enable circuit 13 is connected at the input to an end of the elementary capacitive modules, receiving therefrom suitable detection voltage signals $Vi_i$ and it is connected at the output to the control terminals of the switches, supplying to them suitable voltage control signals $VO_i$. The verify and enable circuit 13 is also supplied by the inner supply voltage reference $V_{OUT}$ and has an enable terminal receiving a suitable enable signal of the verify operations of the capacitive block 11, indicated with VERIFY.

The enable signal VERIFY is set by a so called Power-on-Reset or POR signal, usually in electronic devices and in particular in the memories and reset by one of the signals of end of the power on steps of the device.

In particular, it is to be remembered that if a faultiness of the oxide realizing a given elementary capacitive module is present, this module will show a "leakage" current, usually in the order of the tens of micro-ampere (µA). In other words, the presence of the leakage current is index of a faultiness in the oxide and thus in the elementary capacitive module realized thereby.

Advantageously according to the invention, the verify and enable circuit 13 thus provides to verify the presence of a leakage current and to disable the elementary capacitive modules which show such a current, i.e. a faultiness of the oxide, everything already in a preliminary testing step of the architecture 10 or of a device using it.

In particular, the verify and enable circuit 13 suitably ascertains if a "leakage" current of each elementary capacitive module is present or not, if this "leakage" current is present it excludes the module under examination by means of the corresponding switch.

To do this, the verify and enable circuit 13 comprises a plurality of comparison stages 14, connected to the inner supply voltage reference $V_{OUT}$ and indicated with $AD_1 \ldots AD_N$, as schematically shown in FIG. 4A. In particular, the verify and enable circuit 13 comprises a number N of comparison stages 14 equal to the number of elementary capacitive modules comprised in the capacitive block 11 of the architecture 10.

Figure 4B:
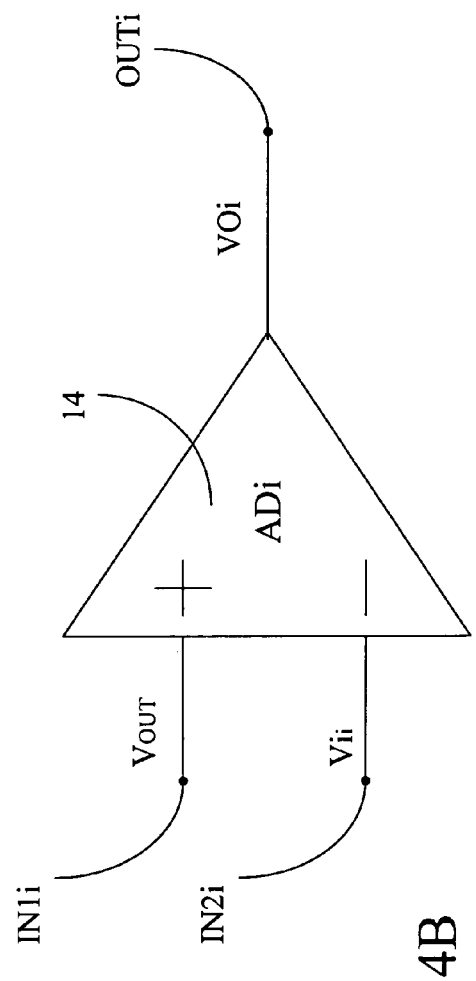
FIG. 4B schematically shows a portion of the detail of FIG. 4A.

A generic comparison stage 14, as schematically shown in FIG. 4B and indicated with ADi, has a first input terminal IN1i, in particular a non inverting input terminal, connected to the inner supply voltage reference $V_{OUT}$, a second input terminal IN2i, in particular an inverting input terminal, connected to an end of a corresponding elementary capacitive module Ci and receiving therefrom the detection voltage signal $Vi_i$, as well as an output terminal OUTi suitable for supplying the enable voltage signal VOi, intended for being supplied to the switch MCi connected to the elementary capacitive module Ci.

Advantageously according to the invention, a comparison stage 14 is configured so as to detect the presence of a "leakage" current in the elementary capacitive module Ci connected thereto and, on the basis of the presence or not of this "leakage" current, to generate a suitable enable voltage signal VOi for the corresponding switch MCi.

A first embodiment of a comparison stage 14 according to the invention is schematically shown in FIG. 5A.

The comparison stage 14 comprises a comparator AD0, in particular a comparator with offset, connected to the inner supply voltage reference VOUT by means of an activation transistor M14 and to the ground GND, having a first input terminal, in particular a non inverting input terminal (+), connected to the inner supply voltage reference VOUT, a second input terminal, in particular an inverting input terminal (−) connected to an end of a corresponding elementary capacitive module Ci and receiving therefrom the detection voltage signal Vii and an output terminal connected to a first input terminal of a logic gate ND. It is to be noted that the first input terminal of the comparator AD0 is connected to a source terminal Si of the switch MCi and the second input terminal of the comparator AD0 is connected to the drain terminal Di of the switch MCi.

In turn, the logic gate ND has a second input terminal receiving a negate value VERIFY_N of the enable signal VERIFY and an output terminal connected to a control terminal of the switch MCi corresponding to the elementary capacitive module Ci and supplying to it the control voltage signal VOi.

Moreover, the negate value VERIFY_N of the enable signal VERIFY is also applied to the control terminal of the activation transistor M14.

In the example shown in FIG. 5A the logic gate ND is of the NAND type and the activation transistor M14 is of the PMOS type.

Let's now see the operation of the comparison stage 14 according to the invention. It is to be noted that each comparison stage 14 is only active during the power-on steps of the architecture 10, the enable signal VERIFY being active during the power-on or during the testing step of the device.

The comparison step 14 carries out, by means of the comparator with offset AD0, a comparison of the voltage values on the drain Di and source Si terminals of the switch MCi, to ascertain the presence or not of a leakage current of the module Ci under examination, this comparison being carried out when this transistor switch MCi is off. In fact, advantageously according to the invention, the negate value VERIFY_N of the enable signal VERIFY activates the verification of the module Ci by enabling the comparator with offset AD0 and turning off the transistor MCi.

At this point, if a leakage current is present, the value of the detection voltage signal $Vi_i$ of the capacity Ci is decreased, causing the releasing of the comparator with offset AD0 and thus the automatic exclusion of the module Ci itself.

In other words, the choice of this offset of the comparator with offset AD0 allows to set the threshold value of the leakage current therefore exclude a determined elementary capacitive module, i.e. consider this module as faulty.

It is also possible to realize the comparison stage 14 according to a further embodiment of the invention schematically shown in FIG. 5B.

The comparison stage 14 comprises a bistable circuit or flip-flop 15, inserted between the inner supply voltage reference $V_{OUT}$, i.e. the source terminal Si of the switch MCi, and the ground GND and having a first set terminal S connected to an end of the module Ci, i.e. to the drain terminal Di of the switch MCi, and receiving therefrom the detection voltage signal $Vi_i$, a second reset terminal R receiving the Power-on-Reset POR signal and an output terminal O.

In particular, the flip-flop 15 comprises a first transistor Ma and a second transistor Mb, inserted, in series to each other, between the inner supply voltage reference VOUT and the ground, the first transistor Ma having a control terminal connected to the first set terminal S of the flip-flop 15 and the second transistor Mb having a control terminal connected to the second reset terminal R of the flip-flop 15.

The flip-flop 15 also comprises a first logic inverter IV1 connected between the output terminal O of the flip-flop 15 and a drain terminal of the first transistor Ma, as well as a second logic inverter IV2 connected between the output terminal O of the flip-flop 15 and a drain terminal of the second transistor Mb, these first IV1 and second logic inverter IV2 being connected to the output terminal O of the flip-flop 15 in opposite directions with respect to each other.

The comparison stage 14 also comprises a logic gate ND having a first input terminal connected to a third logic inverter IV3, in turn being input the enable signal VERIFY, a second input terminal connected to the output terminal O of the flip-flop 15, as well as an output terminal connected to the control terminal of the switch MCi and supplying to it the control voltage signal $VO_i$.

Let's now see the operation of this further embodiment of the comparison stage 14 according to the invention.

The enable signal VERIFY determines the start of the verify step of a given module Ci, powering off the corresponding switch MCi. The detection voltage signal $Vi_i$ biases the control terminal of the first comparison transistor Ma which represents the set terminal S of the flip-flop 15.

The possible leakage current in the module Ci decreases the detection voltage signal $Vi_i$ until the second transistor Mb is powered on and thus the setting of the flip-flop 15 is carried out. This flip-flop 15, changing state, thus causes the deactivation of the corresponding module Ci.

In other words, to verify the integrity of the module Ci, the switch MCi is turned off and, in a time range $\Delta T$, the detection voltage signal $Vi_i$ is measured on the elementary capacitive module Ci. This time range $\Delta T$ is determined by the duration of the enable signal VERIFY.

Moreover, the Power-on-Reset POR signal resets the flip-flop 15 in correspondence with each power-on step of the device.

It is to be noted that a pondered choice of this time range $\Delta T$, i.e. of the duration of the verify step, determined by the time range in which the enable signal VERIFY is active, allows to discriminate leakage currents also of some microampere.

In fact, during the verify step the elementary capacitive module Ci of the capacitive module 11, if a leakage current is present, is discharged. The variation of potential at its ends depends on the value of this leakage current and on the duration $\Delta T$ of the verify step. The choice of this duration $\Delta T$ thus allows to set the threshold value of the leakage current therefore exclude a determined elementary capacitive value, i.e. consider this module as faulty.

Also in this case, the control of the integrity of the modules Ci is carried out by the comparison stage 14 at each power-on step of the architecture 10.

Moreover, advantageously according to the invention, it is possible to implement a verification of the number of active modules of the architecture 10 used inside a memory device of the Flash type.

To do this, the output terminals of the comparator AD0 or of the flip-flop 15 are connected to the DBUS of the Flash memory (the DBUS being a bus of at least 32 bits) and, with the help of the micro-controller inside the Flash memory itself, it is possible to read the values present on these output terminals or also address them onto the DQPAD terminals (output pad) of the Flash memory.

The architecture 10 is advantageously applied in the VDC converters (Voltage Down Converter), in particular in the integration of the tank capacity $C_{TANK}$ of a channel modulation converter VDC.

It is in fact immediate to verify the effective saving in terms of area of the silicon obtained with the use of the architecture 10 for implementing this tank capacity $C_{TANK}$.

By way of verification, the Applicant has carried out integration simulations of a channel modulation converter VDC in 0.13 mm technology according to the following hypothesis: a tank capacity value $C_{TANK}$ being fixed at 1.28 nF, an architecture 10 is realized comprising a capacitive block 11 of N=64 elementary capacitive modules, each module Ci having value equal to 20 pF and being connected to a MCi p-channel enable transistor having size W=120 μm and L=0.18 μm.

Under typical operation conditions, the transistor MCi being simulated shows a power on resistance value RON equal to 4 Ohms, such as not to degrade the performances of the channel modulation converter VDC.

Figure 1:
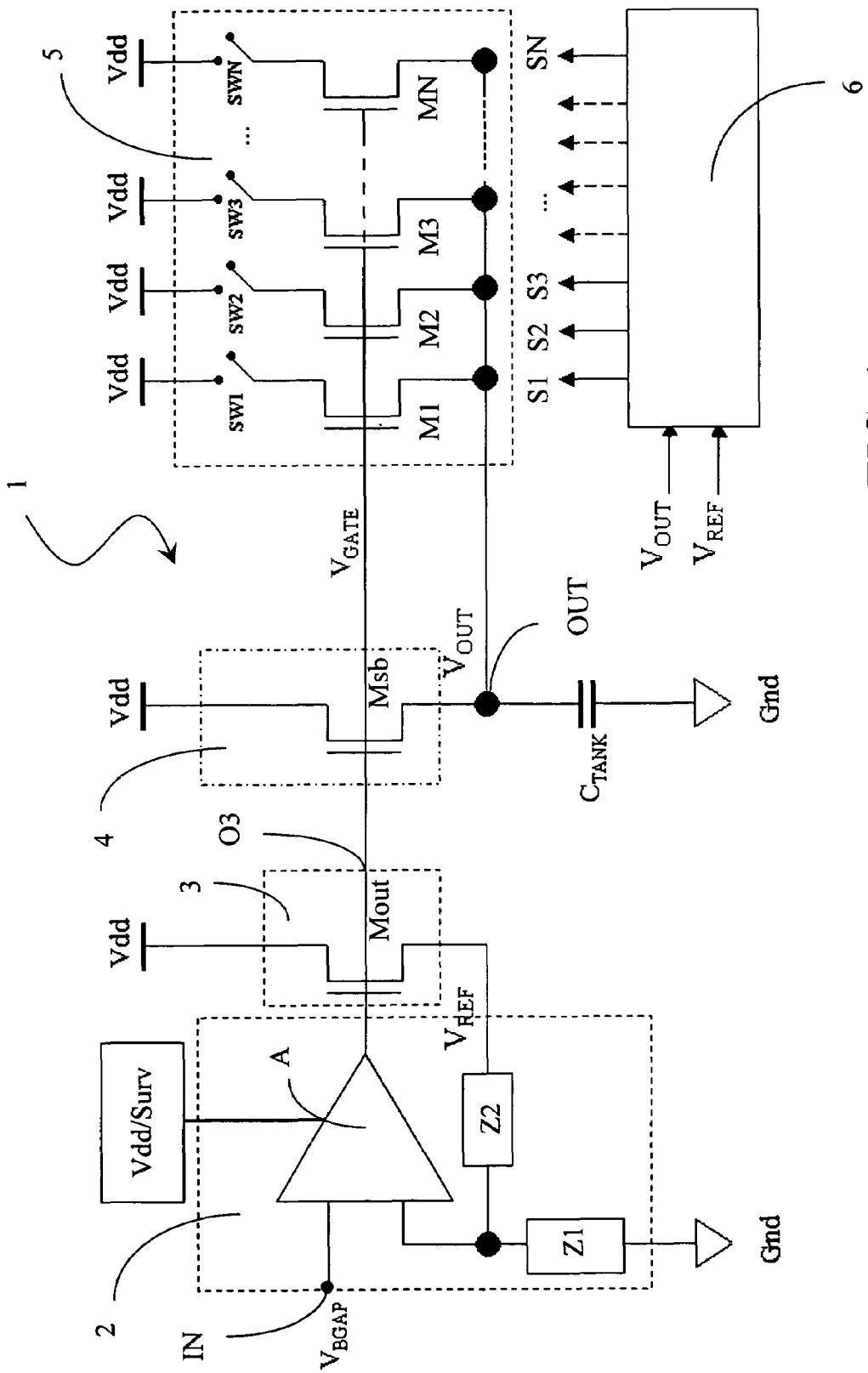
FIG. 1 schematically shows a converter of the Voltage Down type with channel modulation, realized according to the prior art.
Figure 2:
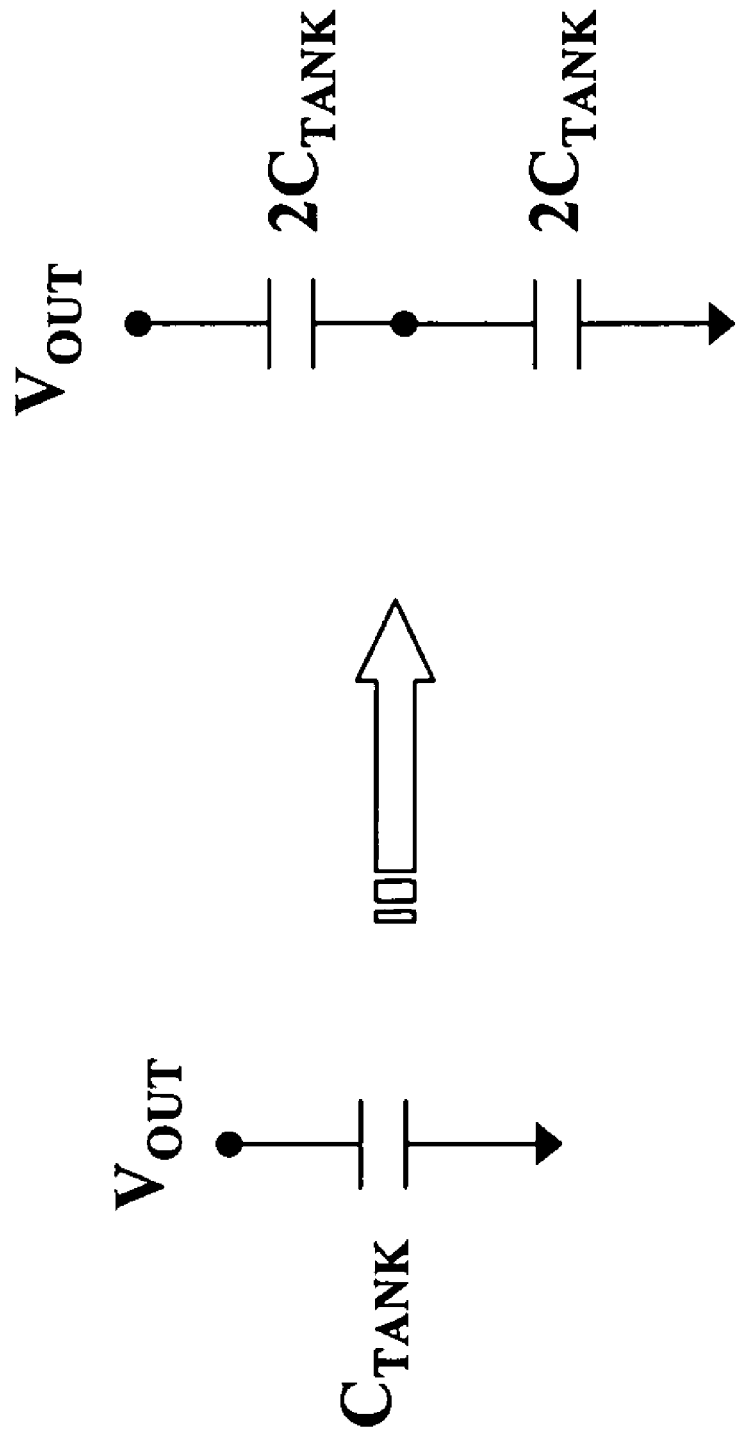
FIG. 2 schematically shows a capacitor comprised in the converter of FIG. 1.

For each comparison stage realized according to the example of FIG. 5B, having size equal to 500 μm² with relative transistor MCi having size equal to 800 μm² and a module of capacity Ci of 20 pF with sized equal to 3400 μm², an area occupation is obtained being totally equal to 4700 μm², by multiplying everything by the number of modules (N=64) a total area equal to 0.3 mm² results. In case of serial implementation (prior art) of the tank capacity $C_{TANK}$ as shown in FIG. 2, with the series of single capacities of 40 pF (so as to obtain the same capacity per module), an area occupied of 11760 μm² results, so as to realize a total capacity of 1.28 nF such value is to be multiplied by 64, obtaining a total area occupied on the silicon equal to 0.75 mm².

It is thus verified how the architecture proposed implies the 60% saving of area on the silicon.

It is also immediate to verify that the percentage relative to the area saving depends on the value chosen as single capacitive module 11 of the architecture 10 used for realizing the tank capacity $C_{TANK}$, as well as on the sizes of the switches MCi. The example used for the simulation represents a compromise between area saving and performances of the converter as a whole.

It is also to be highlighted that this advantage in terms of area saving is even more evident in case the channel modulation converter VDC is used for supplying small Flash memories where the portion of circuitry is strongly affecting in terms of occupied area with respect to the portion of matrixes.

Obviously, one skilled in the art will be allowed to bring several modifications and changes to the above described architecture so as to meet contingent and specific needs, all those modifications and changes falling within the scope of protection of the invention as defined by the following claims.

In particular, it is possible to consider applications wherein it is suitable to carry out an activation/deactivation of the elementary capacitive modules comprised in the capacitive block 11 in a cyclical way, arranging a number N of elementary capacitive modules higher than that necessary for realizing the desired capacity value. In this way, it is in fact possible to reduce the stress accumulated by the elementary capacitive modules and to decrease the breakdown risks of the same.

Although preferred embodiments of the device of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An architecture for implementing an integrated capacitance, comprising:
    a capacitive block, inserted between a first voltage reference and a second voltage references, comprising a plurality of elementary capacitive modules;
    an enable block inserted between said first voltage reference and said capacitive block and comprising a plurality of switches connected to said elementary capacitive modules, the switches being driven on control terminals by a plurality of control signals, each switch of said enable block being inserted between said first voltage reference and a first end of a corresponding elementary capacitive module, a second end of the corresponding elementary capacitive module being connected to said second voltage reference; and
    a verify and enable circuit connected to said first voltage reference and having inputs connected to said first ends of said elementary capacitive modules and having outputs connected to said control terminals of said switches of said enable block, said verify and enable circuit detecting the presence of leakage current in each elementary capacitive module and, if said leakage current is detected, disabling the leaking elementary capacitive module of said capacitive block by means of said corresponding switch of said enable block, wherein the verify and enable circuit includes a circuit which opens a switch of said enable block and measures for a change in voltage across the open switch indicative of leakage current in the elementary capacitive module connected thereto.

2. The architecture according to claim 1, wherein said verify and enable circuit receives at the inputs a plurality of detection voltage signals from said first ends of said elementary capacitive modules of said capacitive block and supplies, at the outputs, a plurality of control voltage signals to said control terminals of said switches of said enable block.

3. The architecture according to claim 1, wherein said verify and enable circuit has an enable terminal receiving an enable signal.

4. The architecture according to claim 1, wherein said capacitive block, said enable block and said verify and enable circuit comprise an identical number of elements.

5. The architecture according to claim 1, wherein said elementary capacitive modules of said capacitive block are sized so that a sum of all the respective capacitive values is equal to a value of capacitance which is to be obtained.

6. The architecture according to claim 1, wherein said switches of said enable block are realized by means of PMOS transistors, preferably of the low voltage type with low power on resistance value.

7. The architecture according to claim 6, wherein said PMOS transistors are sized so as to minimize a total resistance value seen in series to said capacitive block.

8. The architecture according to claim 6, wherein said power on resistance value is chosen being equal to about 5 Ohms for an elementary capacitive module having value equal to 20 Picofarad.

9. An architecture for implementing an integrated capacitance, comprising:
    a capacitive block, inserted between a first voltage reference and a second voltage references, comprising a plurality of elementary capacitive modules;
    an enable block inserted between said first voltage reference and said capacitive block and comprising a plurality of switches connected to said elementary capacitive modules, the switches being driven on control terminals by a plurality of control signals, each switch of said enable block being inserted between said first voltage reference and a first end of a corresponding elementary capacitive module, a second end of the corresponding elementary capacitive module being connected to said second voltage reference; and
    a verify and enable circuit connected to said first voltage reference and having inputs connected to said first ends of said elementary capacitive modules and having outputs connected to said control terminals of said switches of said enable block, said verify and enable circuit detecting the presence of leakage current in each elementary capacitive module and, if said leakage current is detected, disabling the leaking elementary capacitive module of said capacitive block by means of said corresponding switch of said enable block;
    wherein said verify and enable circuit comprises a plurality of comparison stages connected to said first voltage reference.

10. The architecture according to claim 9, wherein each comparison stage has a first input terminal connected to said first voltage reference, a second input terminal connected to said first end of said corresponding elementary capacitive module and receiving therefrom a detection voltage signal from said first end of said corresponding elementary capacitive module of said capacitive block, as well as an output signal connected to said control terminal of said corresponding switch and suitable for supplying to it a corresponding one of said plurality of control signals.

11. The architecture according to claim 10, wherein each comparison stage comprises a comparator with offset connected to said first voltage reference by an activation transistor and to said second voltage reference, said comparator having a first input terminal connected to said first voltage reference, a second input terminal connected to said first end of said corresponding one of said elementary capacitive modules and receiving therefrom said detection voltage signal and having an output terminal connected to said control terminal of said switch corresponding to the elementary capacitive module by means of a logic gate.

12. The architecture according to claim 11, wherein said logic gate has a first input terminal connected to said output terminal of said comparator with offset, a second input terminal receiving a negate value of an enable signal and an output terminal connected to said control terminal of said switch and supplying to it said control signal.

13. The architecture according to claim 12, wherein said negate value of said enable signal is applied to a control terminal of said activation transistor.

14. The architecture according to claim 13, wherein said logic gate is of the NAND type.

15. The architecture according to claim 12, wherein said activation transistor is of the PMOS type.

16. The architecture according to claim 10, wherein each comparison stage comprises a bistable circuit, inserted between said first and second voltage references and having a first input terminal connected to said first end of said corresponding elementary capacitive module and receiving therefrom said corresponding detection voltage signal, a second input terminal receiving a Power-on-Reset signal and an output terminal connected to said control terminal of said corresponding switch by a logic gate.

17. The architecture according to claim 16, wherein said bistable circuit comprises a first transistor and a second transistor, inserted, in series to each other between said first and second voltage references, said first transistor having a control terminal connected to said first input terminal of said bistable circuit and said second transistor having a control terminal connected to said second input terminal of said bistable circuit.

18. The architecture according to claim 17, wherein said bistable circuit further comprises a first logic inverter connected between said output terminal of said bistable circuit and a drain terminal of said first transistor, as well as a second logic inverter connected between said output terminal of said bistable circuit and a drain terminal of said second transistor, said first and second logic inverters being connected to said output terminal in opposite directions with respect to each other.

19. The architecture according to claim 18, wherein said logic gate has a first input terminal connected to a third logic inverter, in turn being input said enable signal, a second input terminal connected to said output terminal of said bistable circuit, as well as an output terminal connected to said control terminal of said corresponding switch for supplying thereto said control voltage signal.

20. The architecture according to claim 19, wherein said third logic inverter enables said logic gate for a time range determined by the duration of said enable signal.

21. A circuit, comprising:
at least one integrated capacitance wherein said capacitance is realized by an architecture comprising:
a capacitive block, inserted between a first voltage reference and a second voltage reference, comprising a plurality of elementary capacitive modules;
an enable block inserted between said first voltage reference and said capacitive block and comprising a plurality of switches connected to said elementary capacitive modules, the switches being driven on control terminals by a plurality of control signals, each switch of said enable block being inserted between said first voltage reference and a first end of a corresponding elementary capacitive module, a second end of the corresponding elementary capacitive module being connected to said second voltage reference; and
a verify and enable circuit connected to said first voltage reference and having inputs connected to said first ends of said elementary capacitive modules and having outputs connected to said control terminals of said switches of said enable block, said verify and enable circuit detecting the presence of leakage current in each elementary capacitive module and, if said leakage current is detected, disabling the leaking elementary capacitive module of said capacitive block by means of said corresponding switch of said enable block, wherein the verify and enable circuit includes a circuit which opens a switch of said enable block for a time period and a set-reset flip flop having a set input terminal connected to receive for the duration of the time period a voltage stored by the elementary capacitive module connected thereto and sense a change in voltage indicative of leakage current in that elementary capacitive module.

22. An integrated circuit, comprising:
a first capacitor;
a second capacitor;
a first transistor switch coupled to a reference voltage and coupled in series with the first capacitor at a first node;
a second transistor switch coupled to the reference voltage and coupled in series with the second capacitor at a second node;
a first sensor circuit coupled to the first node and operable to detect leakage current with respect to the first capacitor and in response thereto disable the first transistor switch; and
a second sensor circuit coupled to the second node and operable to detect leakage current with respect to the second capacitor and in response thereto disable the second transistor switch;
wherein each of the first and second sensor circuits comprises a comparator having a first input terminal connected to the reference voltage, a second input terminal connected to a corresponding one of the first and second nodes to receive a detection voltage signal, and an output generating a control signal for connection to control disabling of the respective first and second transistor switch.

23. The circuit of claim 22 wherein each of the first and second sensor circuits further comprises a logic gate having a first input receiving the control signal, a second input receiving an enable signal and an output connected to the respective first and second transistor switch.

24. An integrated circuit, comprising:
a first capacitor;
a second capacitor;
a first transistor switch coupled to a reference voltage and coupled in series with the first capacitor at a first node;
a second transistor switch coupled to the reference voltage and coupled in series with the second capacitor at a second node;
a first sensor circuit coupled to the first node and operable to detect leakage current with respect to the first capacitor and in response thereto disable the first transistor switch; and
a second sensor circuit coupled to the second node and operable to detect leakage current with respect to the second capacitor and in response thereto disable the second transistor switch;
wherein each of the first and second sensor circuits comprises a bistable circuit having a first input terminal connected to a corresponding one of said first and second nodes to receive a detection voltage signal, a second input terminal receiving a reset signal and an output generating a control signal for connection to control disabling of the respective first and second transistor switch.

25. The circuit of claim 24 wherein each of the first and second sensor circuits further comprises a logic gate having a first input receiving the control signal, a second input receiving an enable signal and an output connected to the respective first and second transistor switch.

26. The circuit of claim 24 wherein the first and second transistor switches are coupled to the reference voltage and the first and second capacitors are coupled to another voltage.

27. The circuit of claim 24 wherein each of the first and second sensor circuits functions when enabled to supply charging current to the respective first and second capacitor.

* * * * *

UNITED STATES PATENT AND TRADEMARK OFFICE
CERTIFICATE OF CORRECTION

| | | |
|---|---|---|
| PATENT NO. | : 7,414,459 B2 | Page 1 of 1 |
| APPLICATION NO. | : 11/444287 | |
| DATED | : August 19, 2008 | |
| INVENTOR(S) | : Michelangelo Pisasale et al. | |

It is certified that error appears in the above-identified patent and that said Letters Patent is hereby corrected as shown below:

Title page, item [57] Abstract, third line, please replace the word [reference] with the word -- references --.

Title page, item [57] Abstract, third line, please remove the duplicate phrase [The block is formed].

Column 9, claim 1, line 17, replace the word [references] with the word -- reference --.

Column 10, claim 9, line 8, replace the word [references] with the word -- reference --.

Signed and Sealed this
Second Day of August, 2011

David J. Kappos
*Director of the United States Patent and Trademark Office*